(12) United States Patent
Grelaud et al.

(10) Patent No.: US 10,236,865 B2
(45) Date of Patent: Mar. 19, 2019

(54) TRANSMISSION LINE WITH DEVICE FOR LIMITING LOSSES THROUGH IMPEDANCE MISMATCH

(71) Applicant: STMicroelectronics SA, Montrouge (FR)

(72) Inventors: Bruno Grelaud, Grenoble (FR); Sebastien Pruvost, Crolles (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 15/952,804

(22) Filed: Apr. 13, 2018

(65) Prior Publication Data

US 2018/0302063 A1 Oct. 18, 2018

(30) Foreign Application Priority Data

Apr. 13, 2017 (FR) .................... 17 53259

(51) Int. Cl.

| | |
|---|---|
| H04B 1/18 | (2006.01) |
| H04B 3/26 | (2006.01) |
| H03H 11/28 | (2006.01) |
| H03H 11/32 | (2006.01) |
| H03H 11/24 | (2006.01) |
| H01Q 1/50 | (2006.01) |
| H04L 25/12 | (2006.01) |
| H04B 1/04 | (2006.01) |
| H04L 25/02 | (2006.01) |

(Continued)

(52) U.S. Cl.
CPC .............. *H03H 11/28* (2013.01); *H01Q 1/50* (2013.01); *H03H 7/25* (2013.01); *H03H 7/40* (2013.01); *H03H 11/245* (2013.01); *H03H 11/30* (2013.01); *H03H 11/32* (2013.01); *H04B 1/0458* (2013.01); *H04B 1/18* (2013.01); *H04B 3/26* (2013.01); *H04L 25/0278* (2013.01); *H04L 25/12* (2013.01)

(58) Field of Classification Search
CPC combination set(s) only.
See application file for complete search history.

(56) References Cited

U.S. PATENT DOCUMENTS

| | | | |
|---|---|---|---|
| 6,208,846 B1 * | 3/2001 | Chen ..................... | H04W 52/52 330/151 |
| 2004/0147575 A1 | 7/2004 | Soldato | |

(Continued)

FOREIGN PATENT DOCUMENTS

CN 101527693 A 9/2009

OTHER PUBLICATIONS

INPI Search Report and Written Opinion for FR 1753259 dated Dec. 7, 2017 (7 pages).

*Primary Examiner* — Cindy Trandai (74) *Attorney, Agent, or Firm* — Crowe & Dunlevy (57) ABSTRACT

An attenuator having an impedance that is controllable by a first setpoint signal is coupled to a transmission line. A matching circuit having an impedance that is controllable by a second setpoint signal is also coupled to the transmission line. A transformer circuit block also coupled to the transmission line has a complex impedance. A control circuit sets the first and second setpoint signals so as to control a conjugate impedance relationship between the variable impedances presented by the attenuator and matching circuit relative to the complex impedance of the transformer circuit.

26 Claims, 5 Drawing Sheets

(51) Int. Cl.
  *H03H 7/25*    (2006.01)
  *H03H 7/40*    (2006.01)
  *H03H 11/30*   (2006.01)

(56) References Cited

U.S. PATENT DOCUMENTS

| | | | |
|---|---|---|---|
| 2006/0151591 A1 | 7/2006 | Matsuno | |
| 2011/0115565 A1* | 5/2011 | Cabanillas | H03F 1/0277 |
| | | | 330/307 |
| 2011/0298537 A1* | 12/2011 | Homol | H03F 3/72 |
| | | | 330/124 R |
| 2013/0040695 A1* | 2/2013 | Yu | H03F 3/193 |
| | | | 455/550.1 |
| 2014/0028521 A1* | 1/2014 | Bauder | H03H 7/38 |
| | | | 343/861 |
| 2014/0321295 A1* | 10/2014 | Fella, Jr. | H04L 41/069 |
| | | | 370/252 |
| 2016/0094190 A1* | 3/2016 | Young | H03H 7/40 |
| | | | 330/250 |
| 2016/0226552 A1* | 8/2016 | Jin | H03F 1/0227 |
| 2017/0359044 A1* | 12/2017 | Kishi | H03B 5/32 |
| 2018/0138878 A1* | 5/2018 | Domino | H03G 1/0088 |
| 2018/0175828 A1* | 6/2018 | Ashry Othman | H03H 11/245 |
| 2018/0226924 A1* | 8/2018 | Ngai | H03F 3/21 |
| 2018/0226932 A1* | 8/2018 | Beaudin | H03F 1/0244 |

* cited by examiner

TRANSMISSION LINE WITH DEVICE FOR LIMITING LOSSES THROUGH IMPEDANCE MISMATCH

PRIORITY CLAIM

This application claims the priority benefit of French Application for Patent No. 1753259, filed on Apr. 13, 2017, the disclosure of which is hereby incorporated by reference in its entirety to the maximum extent allowable by law.

TECHNICAL FIELD

Various embodiments and their implementation relate to information transmission lines, in particular radiofrequency, and notably transmission lines comprising a plurality of blocks mutually coupled in pairs where the impedance of at least some of the blocks may vary, and more particularly, the reduction in mismatch and, consequently, the reduction in the signal reflection losses within such transmission lines.

BACKGROUND

In the field of radio communications, it is conventional to try to maintain the power at the output of a transmission line at a constant value, or, at the very least, to try to maintain constant impedances in order to guarantee the integrity of the signal all along the chain of a communications system.

However, owing to numerous factors, notably environmental, such as temperature, significant variations in power may be observed and compensation for those variations is desirable.

There exist means for compensating for these variations in power, such as for example through the use of an attenuator or attenuation cells placed between two successive blocks which regulate the amplitude of the transmitted signals as a function of a setpoint signal, whose value depends notably on the value of the output power and on the external conditions.

However, these attenuators have variable impedances, and the differences of impedance between these attenuators and the blocks which follow them lead to significant losses in the power of the signal and a degradation of the integrity of the signal. Moreover, the variation in impedance of the attenuators can interfere with the operation of the block that follows, for example an antenna.

There accordingly exists a need to effectively limit the variations in impedances within a transmission line for the purpose of guaranteeing therein a better control of power.

SUMMARY

Thus, according to one embodiment, an impedance matching device within a transmission line allows for a correct impedance matching between two successive blocks of which at least one of the two blocs exhibits a variable impedance.

According to one aspect, a transmission line is provided comprising an output interface and at least one device coupled to the output interface (which may, for example, be coupled to an antenna or to another transmission line), the device comprising an attenuator whose impedance is controllable by a first setpoint signal, an intermediate block having a complex impedance coupled to the output of the attenuator, and a control circuit configured for adjusting the value of the first setpoint signal in such a manner as to maintain a substantially constant power at the output interface, the attenuator and the intermediate block being configured so as to have conjugated respective impedances in the presence of a first setpoint signal having a first value, for example a value of zero.

The device further comprises a matching circuit coupled to the input or output of the attenuator and whose impedance is controllable by a second setpoint signal adjustable by the control circuit, which can take a second value, in the presence of which the impedance of the matching circuit is such that the matching circuit has a negligible effect on the rest of the transmission line, the attenuator and the matching circuit being configured for, in the presence of the first setpoint signal and of the second setpoint signal having, respectively, values different from the first value and from the second value, for example non-zero values, maintaining an equivalent impedance of the assembly comprising the attenuator and the matching circuit substantially equal to the conjugate impedance of the intermediate block.

Thus, although the impedance of the attenuator varies, the matching circuit allows a correct impedance matching to be maintained irrespective of the value of the impedance of the attenuator, and therefore the losses of power from the signal by mismatch to be limited, and also the integrity of the signal to be guaranteed between the attenuator and the intermediate block, and also between the intermediate block and the following block.

According to one embodiment, the attenuator comprises a first terminal and a second terminal, input or output, and the matching circuit comprises a module having a complex impedance which is non-modifiable by the first or the second setpoint signal, a first adjustment element coupled between a first terminal of the module and the first input or output terminal of the attenuator, a second adjustment element coupled between the second terminal of the module and the second input or output terminal of the attenuator, the first adjustment element and the second adjustment element having impedances which are adjustable by the second setpoint signal.

These adjustment elements may be elements having a complex impedance comprising a real part and an imaginary part, such as for example transistors.

Thus, the second setpoint signal allows the impedance of the matching circuit seen by the intermediate block to be varied in a simple manner, without having to directly act on the module.

The attenuator may comprise at least one resistive-capacitive circuit, whose resistive value and whose capacitive value are adjustable by the first setpoint signal.

The adjustment elements and the at least one resistive-capacitive circuit may comprise transistors whose gates are configured for receiving the second setpoint signal, the second setpoint signal allowing the resistive value of the transistors in the conducting state to be modified.

Since the driving into conduction of the transistors is not a linear phenomenon, it may be advantageous to use different control laws or formulae for the generation of the first setpoint signal and of the second setpoint signal in order to compensate for the imperfections of the transistors and thus to obtain an impedance compensation that is the best possible.

The resistive value here represents the variation in conduction of the transistors which also comprise capacitive and inductive parts.

Thus, the resistive-capacitive circuits are of simple construction and are easily adjustable by a biasing of the gates of the transistors.

The second setpoint signal which biases the gates of the transistors may be directly applied to the matching circuit or else may come from an initial signal having undergone a modification (for example, according to a polynomial law or formula).

According to one embodiment, the module comprises a capacitor, and the matching circuit comprises a variable capacitance.

Indeed, since the real part, or resistive part, of the impedance of the attenuator hardly varies, the impedance variation is mainly due to a variation of its imaginary part, or reactive part, and the employment of a component having an impedance that is for the most part reactive, such as a capacitor is therefore advantageous for compensating the variation in the imaginary part of the complex impedance of the attenuator.

The module may comprise a plurality of capacitors.

According to another embodiment, the module comprises a coil, and the matching circuit comprises a variable inductance.

The module may comprise a plurality of coils.

The transmission line may comprise a plurality of devices with a structure analogous to that of the at least one device such as that previously described.

The first setpoint signal and the second setpoint signal may be identical.

According to another aspect, a communications apparatus is provided comprising a radiofrequency transmitter and/or receiver, and comprising a transmission line such as previously defined.

The communications apparatus may be a cellular mobile telephone or a digital tablet.

BRIEF DESCRIPTION OF THE DRAWINGS

Other advantages and features of the invention will become apparent upon examining some non-limiting embodiments and from the appended drawings in which.

DETAILED DESCRIPTION

The phrase "substantially equal" as used herein is understood to mean "equal to within a margin of error of 10%" as it is generally considered by those skilled in the art.

The phrase "substantially constant" as used herein is understood to mean "constant to within a margin of error of 10%" as it is generally considered by those skilled in the art.

An element of an electronic circuit herein has a resistive value considered as infinite or substantially infinite if, when being connected to a given point of the circuit, it forms a branch whose resistive value is greater than ten times the value of the modulus of the impedance at the point.

Figure 1:
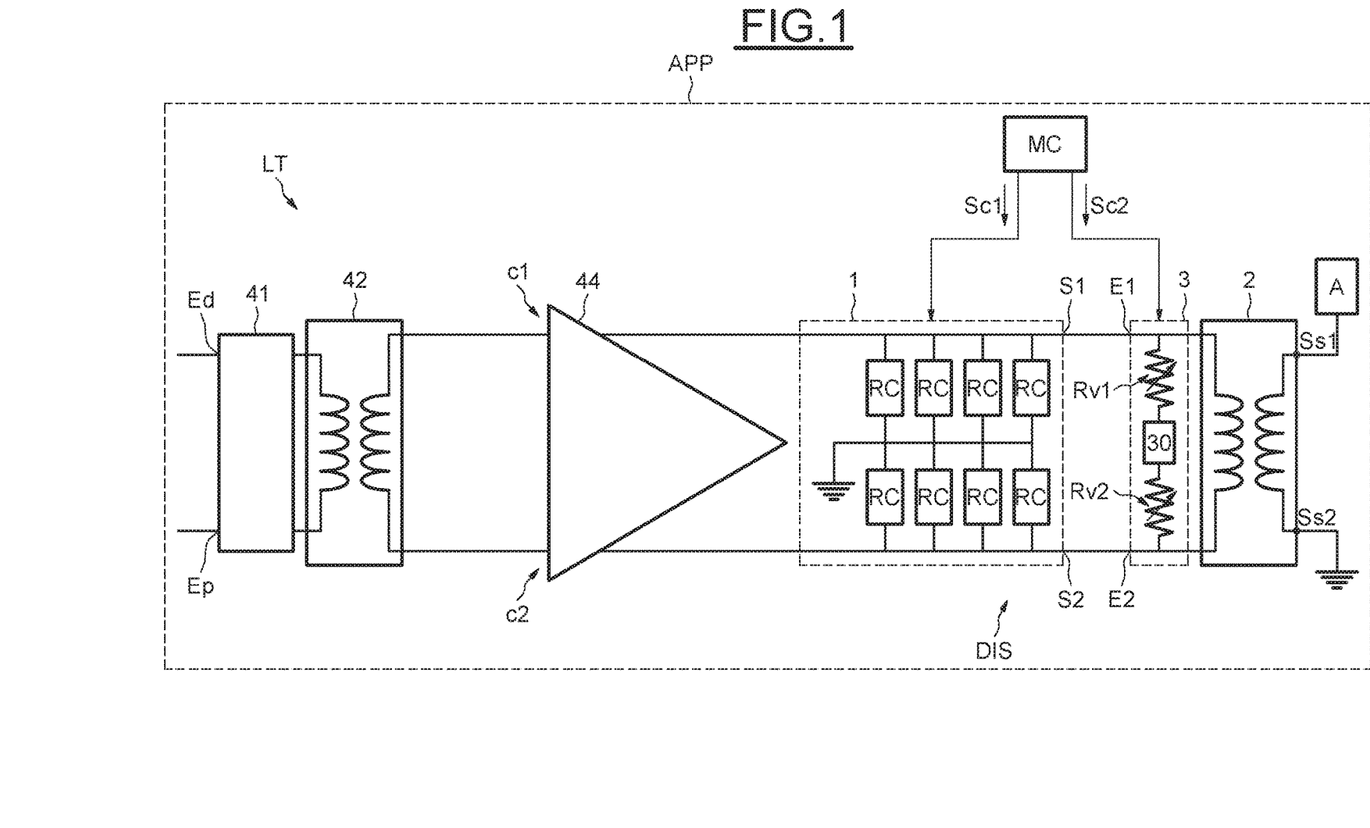
FIG. 1 illustrates a radiofrequency transmission line with two conductors and an impedance matching device.

FIG. 1 illustrates a radiofrequency transmission line LT with two conductors c1 and c2, comprising an impedance matching device DIS according to one embodiment.

Figure 6:
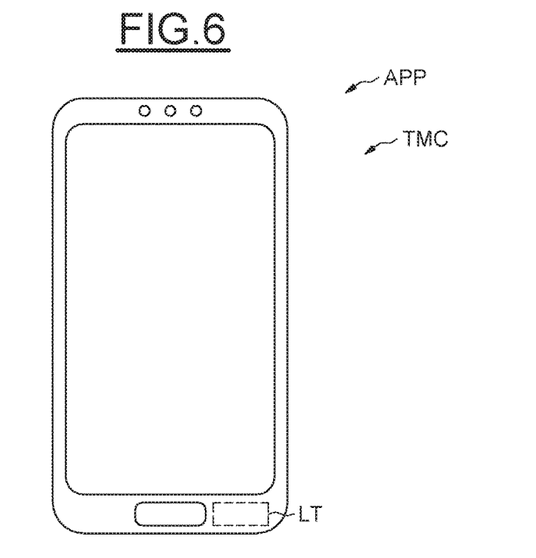
FIGS. 6-7 illustrate product implementations.
Figure 7:
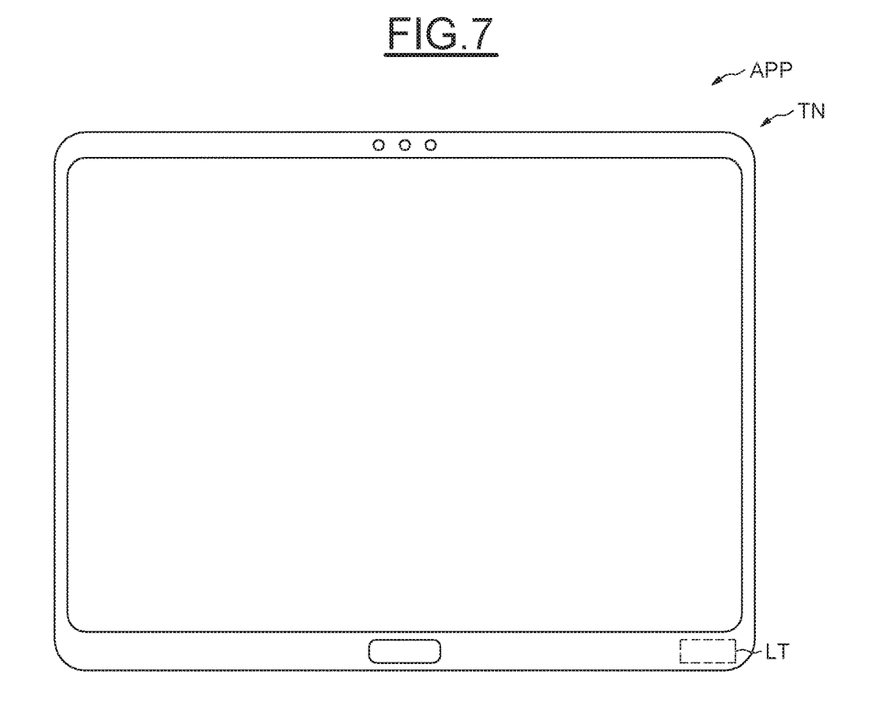

The transmission line may, for example, be included in a communications apparatus APP, in particular a wireless communications apparatus, for example a cellular mobile telephone or a digital tablet, or any other communications apparatus equipped with a radiofrequency transmitter and/or receiver (see, generally, FIGS. 6-7).

The transmission line LT conventionally comprises a plurality of successive quadrupoles, or blocks, each configured for performing an operation on a signal flowing within the transmission line and destined to be transmitted over an output interface Ss1, Ss2, coupled, for example, to an antenna circuit.

The signal flowing on the transmission line LT is supplied by a mixer 41, comprising a data input Ed configured for receiving a data signal in base band, and a carrier input Ep configured for receiving a radiofrequency signal, acting as a frequency transposition signal.

The mixer 41 is configured for combining the data signal and the radiofrequency signal, here acting as a carrier, in order to transpose the signal to be transmitted into the radiofrequency domain.

The mixer 41 is coupled to an impedance matching circuit 42, conventionally allowing the impedance of the mixer 41 to be adapted to the impedance of the quadrupole directly following it in the transmission line LT, here an amplifier 44.

Obtaining a correct impedance matching allows the signal reflections to be minimized, or even eliminated, and thus the transfer of power from one quadrupole to another to be optimized by limiting the losses through impedance mismatch.

For a given frequency, there is an impedance match between a transmitter circuit and a receiver circuit when the complex impedance of the transmitter circuit is equal to the conjugate of the complex impedance of the receiver circuit.

The output of amplifier 44 is coupled to the input of the device DIS.

The device DIS comprises an attenuator 1, an intermediate block 2, here a transformer of the balanced-unbalanced type (known as a "balun") coupled to the antenna circuit A and to ground, a matching circuit 3 coupled between the first attenuator 1 and the intermediate block 2, and a control circuit MC configured for delivering a first setpoint signal Sc1 to the attenuator 1 and a second setpoint signal Sc2, distinct from the first setpoint signal Sc1, to the matching circuit 3.

It should be noted that, although the control circuit MC delivers two separate setpoint signals Sc1 and Sc2, it would be perfectly possible for the control circuit MC to deliver the same setpoint signal to the attenuator 1 and to the matching circuit 3.

However, when the first signal Sc1 and the second signal Sc2 are separate signals, then the values of the first setpoint signal Sc1 and of the second setpoint signal Sc2 are linked via a coefficient which depends on the structures of the attenuator 1 and of the matching circuit 3, and their respective variations are hence dependent on each other.

The attenuator 1 and the intermediate block 2 are formed in such a manner that, when the first setpoint signal Sc1 has a first value, for example here a value of zero, and when the second setpoint signal Sc2 has a second value, for example here a value of zero, the impedance of the attenuator 1 and of the intermediate block 2 are matched, in other words the complex impedance of one is equal to the conjugate of the complex impedance of the other.

When the value of the second setpoint signal Sc2 is zero, the matching circuit 3 has a negligible effect on the rest of the circuit, as will be seen hereinafter, and therefore, when the values of the setpoint signals Sc1 and Sc2 are zero, the assembly formed by the attenuator 1 and the matching circuit 3 has an impedance equal to the conjugate of the impedance of the intermediate block 2.

The attenuator 1 is coupled to the output of the amplifier 44 and here comprises a plurality of identical resistive-capacitive circuits RC, each comprising a resistive element and a capacitive element, four of which are coupled in parallel with each other between the first conductor c1 and ground, and another four are coupled in parallel with each other between the second conductor c2 and ground.

As a variant, the resistive-capacitive circuits RC could be coupled directly between the first conductor c1 and the second conductor c2.

According to another variant, the second conductor c2 could be connected to ground, in which case the resistive-capacitive circuits RC would only be connected between the first conductor c1 and ground.

Here, the resistive-capacitive circuits RC are coupled to the control circuit MC, their resistive values and their capacitive values being adjustable via the first setpoint signal Sc1.

The control circuit MC here, by delivering the first setpoint signal Sc1 to the attenuator 1, is configured for maintaining the power transmitted to the antenna circuit A at a substantially constant value.

The control circuit MC, for example, comprises sensors configured for measuring various parameters of the communications apparatus APP able to make the power supplied to the antenna circuit A vary, such as, for example, the temperature, the input power, and/or the output power itself, and a processing circuit configured for processing the information coming from the sensors in order to generate the first setpoint signal Sc1 and the second setpoint signal Sc2, whose values are dependent on the information coming from the sensors.

The setpoint signals Sc1 and Sc2 may, for example, have undergone modifications by the processing circuit, for example according to a polynomial law or formula.

Figure 2:
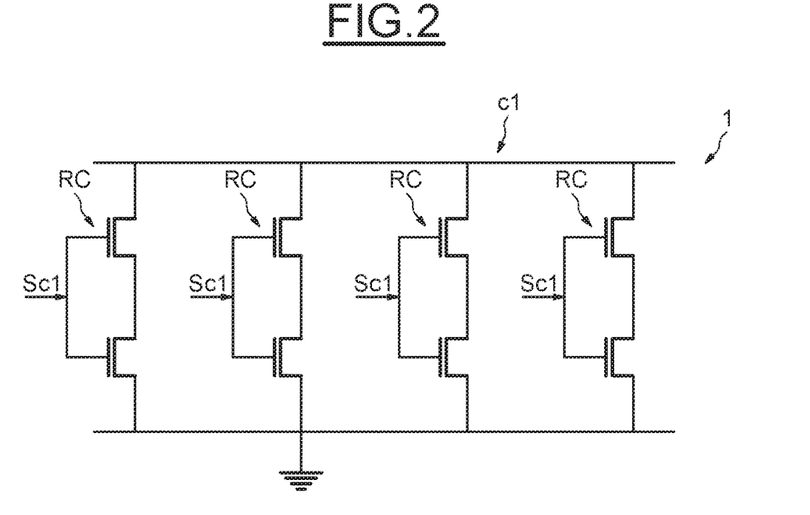
FIG. 2 shows a resistive-capacitive circuit.

As is illustrated in FIG. 2, each resistive-capacitive circuit RC is in practice formed by two MOS transistors, here n-channel (NMOS) transistors, coupled in series and whose gate is coupled to the control circuit MC and driven by the signal Sc1.

When the first setpoint signal Sc1 has the first value, here a value of zero, in other words when the value of the output power does not need to be adjusted, the transistors are turned off and the resistive value is considered as infinite, and the attenuator 1 is inactive. When the first setpoint signal Sc1 has a value different from the first value, here a non-zero value, in other words when the value of the output power drifts off its initial value and needs to be adjusted, the transistors become conducting, and their resistive values in the conducting state vary with the value of the first setpoint signal Sc1.

The attenuator 1 then enables an attenuation proportional to the resistive value of the transistors in the conducting state, and hence proportional to the first setpoint signal Sc1 and to the second setpoint signal Sc2 which is linked to the first setpoint signal via a coefficient, as will be seen hereinafter.

The capacitive value of the resistive-capacitive circuits RC comprises the capacitive values of the drain-source capacitances of the transistors, and the capacitive value is a maximum when the value of the first setpoint signal Sc1 is zero, and decreases as the value of the first setpoint signal Sc1 increases.

Here, by way of example, the first setpoint signal Sc1 can vary between 0 and 2.5 volts.

However, the variation of the resistive values and of the capacitive values of the resistive-capacitive circuits RC of the attenuator 1 leads to a variation in the impedance of the attenuator 1 and, since the impedance of the intermediate block 2 does not vary, hence to a degradation in the impedance matching between the attenuator 1 and the intermediate block 2.

In particular, the variation of the capacitive values of the resistive-capacitive circuits RC leads to a variation of the imaginary part of the complex impedance of the attenuator 1, and the variation of the resistive values of the resistive-capacitive circuits, negligible with respect to the resistive values of the first and second conductors c1 and c2, only results in a very small variation in the real part of the complex impedance of the attenuator 1.

This impedance variation therefore needs to be compensated in order to maintain a correct impedance matching between the attenuator 1 and the intermediate block 2, so as to guarantee the integrity of the signal.

For this purpose, the matching circuit 3 here is coupled to the output of the attenuator, between a first output terminal S1 and a second output terminal S2 of the attenuator 1.

However, the matching circuit could just as well be coupled to the input of the attenuator.

The first output terminal S1 is coupled to a first input terminal E1 of the intermediate block 2, and the second output terminal S2 is coupled to a second input terminal E2 of the intermediate block 2.

The matching circuit 3 comprises a module 30 having a complex impedance, non-adjustable by the second setpoint signal Sc2, a first adjustment element Rv1 coupled between the first output terminal S1 and a first terminal of the module 30, a second adjustment element Rv2 coupled between the second output terminal S2 and a second terminal of the module 30.

When the second setpoint signal Sc2 has the second value, in other words here a value of zero, the resistive values of the first and second adjustment elements Rv1 and Rv2 are considered as infinite and the matching circuit 3 has a negligible effect on the rest of the transmission line LT.

Moreover, the resistive values of the first and second adjustment elements Rv1 and Rv2 decrease with the increase in the value of the second setpoint signal Sc2.

Thus, although the complex impedance of the module 30 is not adjustable by the second setpoint signal Sc2, the variation of the resistive values of the first adjustment element Rv1 and of the second adjustment element Rv2 allows the impedance of the matching circuit 3 seen by the intermediate block 2 to be varied.

In other words, the impedance of the matching circuit 3 seen by the intermediate block 2 increases with the decrease in the resistive values of the adjustment elements Rv1 and Rv2, and hence with the increase in the value of the second setpoint signal Sc2.

The coefficient between the value of the first setpoint signal Sc1 and the value of the second setpoint signal Sc2 may depend on the transfer function of the transistors of the attenuator 1 and on the transfer function of the adjustment elements Rv1 and Rv2 of the matching circuit 3.

Thus, the coefficient will have a value close to one if the transfer function of the transistors of the attenuator 1 is equal to the transfer function of the adjustment elements Rv1 and Rv2, and will have a value different from one if the transfer function of the transistors of the attenuator 1 and the transfer function of the adjustment elements Rv1 and Rv2 are very different.

Figure 3:
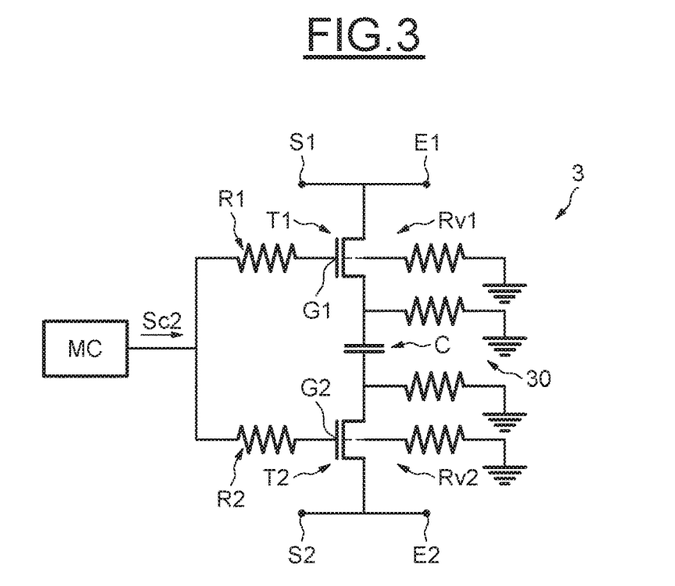
FIGS. 3-4 show examples of matching circuits.

In the example illustrated in FIG. 3, the module 30 is a capacitor C having a capacitance non-adjustable by the second setpoint signal Sc2, and a complex impedance having a real part close to zero.

The adjustment elements Rv1 and Rv2 are, in practice, MOS transistors, here NMOS transistors T1 and T2, whose gates G1 and G2 are coupled to the control circuit MC and are coupled to respond to the second setpoint signal Sc2.

The gate G1 of the first transistor T1 is coupled to the control circuit MC via a first filter resistance R1, which forms a low-pass filter with the drain-gate capacitance of the first transistor T1, and the gate G2 of the second transistor T2 is coupled to the control circuit MC via a second filter resistance R2, which forms a low-pass filter with the drain-gate capacitance of the second transistor T2.

This advantageously allows the radiofrequency signal flowing on the first and the second conductors c1 and c2 to be transmitted by capacitive coupling to the gates G1 and G2 of the first and second transistors T1 and T2, and hence not to interfere with the second setpoint signal Sc2.

A resistance is coupled between the substrate (body) of each transistor and ground, and also between each of the electrodes of the module 30 and ground, in order to limit the leakage currents.

Thus, the higher the value of the second setpoint signal Sc2, the lower the resistive value of the transistors T1 and T2 in the conducting state, and hence the more the capacitor C is visible to the intermediate block 2.

In other words, as the value of the second setpoint signal Sc2 increases, the capacitive value of the matching circuit 3 also increases, and hence the imaginary part of its impedance increases.

The variation of the resistive values of the first and second adjustment elements Rv1 and Rv2 is negligible in comparison with the resistive values of the first and second conductors c1 and c2, and therefore the real part of the complex impedance of the matching circuit 3 hardly varies.

Thus, the increase in the values of the setpoint signals Sc1 and Sc2 makes, on the one hand, the value of the imaginary part of the complex impedance of the attenuator 1 fall, and on the other hand, the imaginary part of the complex impedance of the matching circuit 3 increase.

The decrease in the imaginary part of the complex impedance of the attenuator 1 is therefore compensated by the increase in the imaginary part of the complex impedance of the matching circuit 3, and the complex impedance of the assembly comprising the attenuator 1 and the matching circuit 3 seen by the intermediate block 2 is thus maintained at a value equal to the conjugate of the complex impedance of the intermediate block 2.

Thus, the device DIS advantageously allows a correct impedance matching to be maintained despite the variations in the impedance of the attenuator 1, which allows the integrity of the signal in the antenna circuit A to be maintained by a minimization of the impedance mismatch.

Figure 4:
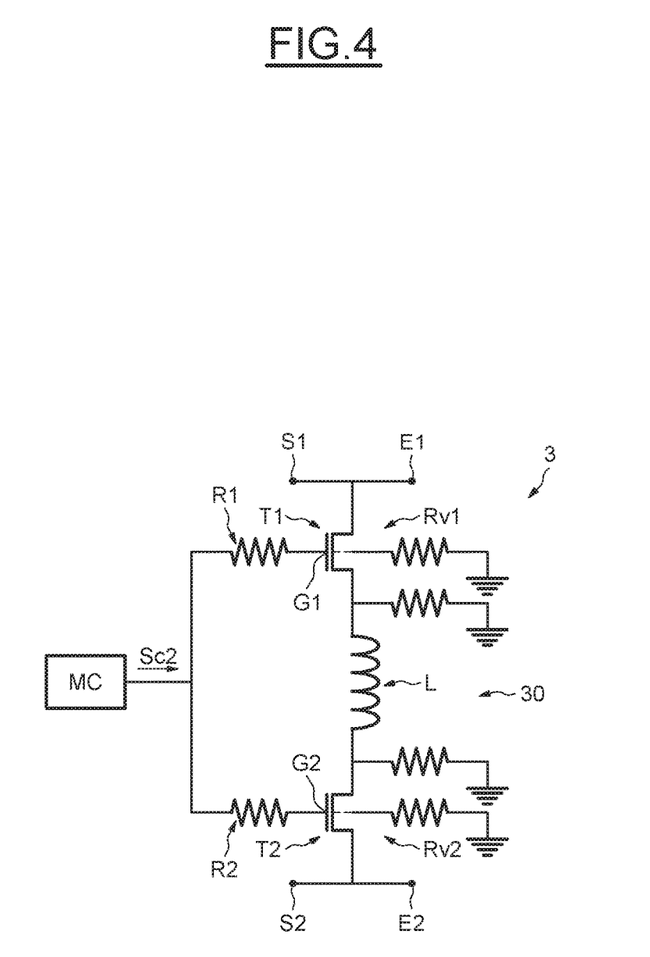

Although a matching circuit 3 comprising a capacitor C has been described in FIG. 3, it is equally possible, as illustrated in FIG. 4, for the module 30 to comprise another type of component having a complex impedance that is mostly reactive, such as for example an inductor coil L.

The module 30 may also comprise a plurality of capacitors, a plurality of coils, or at the same time one or more capacitors and one or more coils or, again, a combination of various components including coils and/or capacitors.

Furthermore, it could be necessary to compensate the variation in the real part of the impedance. For this purpose, it would be possible to add a real component, for example a resistance, in the module 30.

Furthermore, although a transmission line LT comprising a single device DIS has been previously described, it is perfectly possible to envisage a transmission line comprising several devices analogous to the device DIS previously described in relation with FIGS. 1 to 4.

Figure 5:
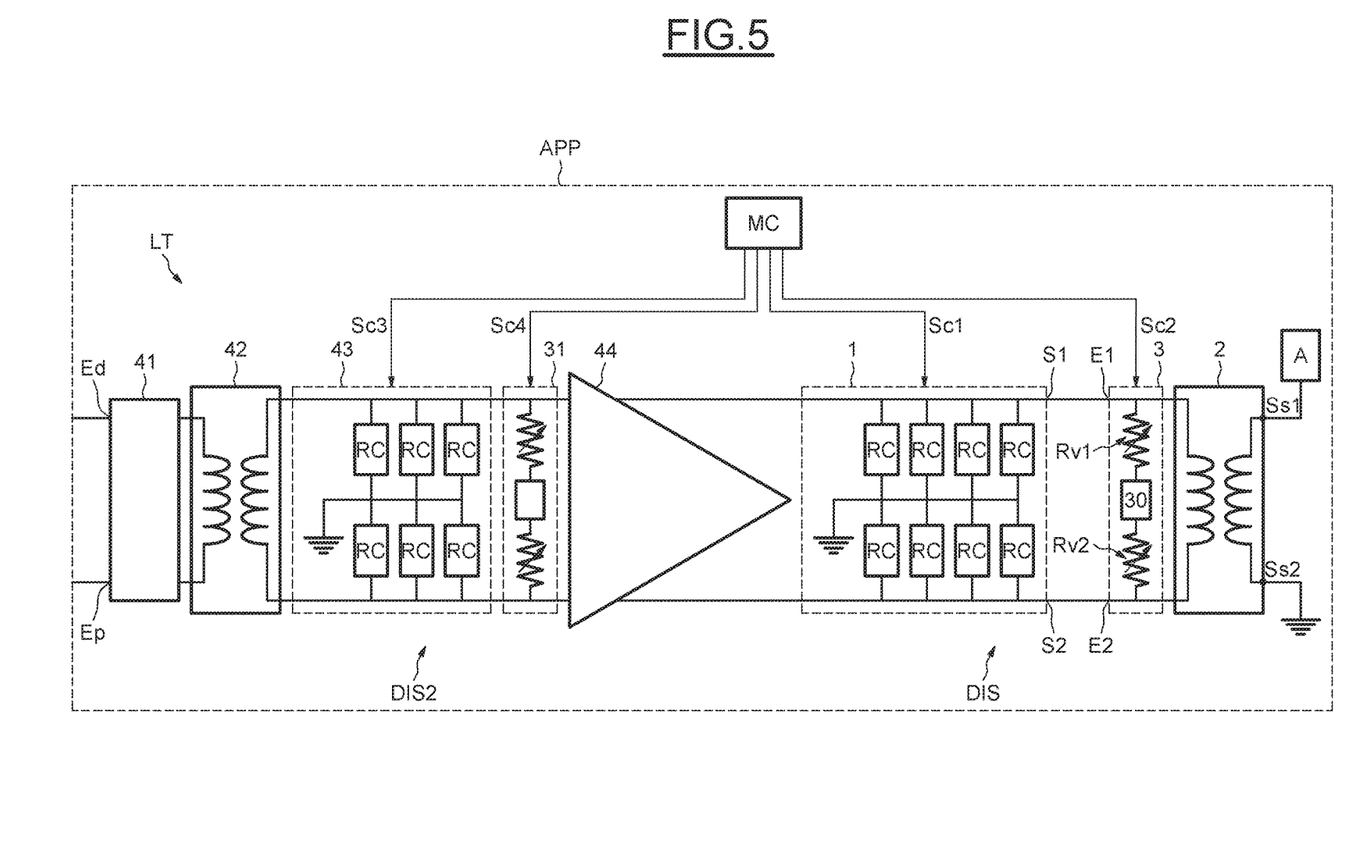
FIG. 5 illustrates a radiofrequency transmission line with two conductors and impedance matching circuitry.

This is illustrated in more detail in FIG. 5.

In FIG. 5, the transmission line LT additionally comprises a second device DIS2 comprising a second attenuator 43 and a second matching circuit 31.

The second attenuator 43 has a structure and an operation analogous to that of the attenuator 1, and is coupled to the control circuit MC so as to receive a third setpoint signal Sc3.

The second attenuator 43, controlled by the control circuit MC, therefore contributes to the maintenance of the integrity of the signal transmitted to the antenna circuit A.

The second attenuator 43 here comprises three resistive-capacitive circuits RC coupled in parallel with each other between the first conductor c1 and ground, and three resistive-capacitive circuits coupled in parallel with each other between the second conductor c2 and ground, instead of four in the attenuator 1 described previously.

It should be noted that it would be possible for the second attenuator 43 to comprise a greater number of resistive-capacitive circuits RC. However, each resistive-capacitive circuit RC generates noise, and the generation of noise at the input of the amplifier should be limited in order to preserve a good signal-to-noise ratio at the output of the amplifier.

Thus, a reduced number of resistive-capacitive circuits at the input of the amplifier 44 advantageously allows a good signal-to-noise ratio to be conserved at the output of the amplifier 44.

Those skilled in the art will know how to adjust the number of resistive-capacitive circuits RC according to the type of amplifier used and to the applications envisaged.

When the value of the third setpoint signal Sc3 is zero, the complex impedance of the second attenuator and the complex impedance of the amplifier 44 are matched, in other words the value of one is equal to the conjugate value of the other.

Moreover, since the resistive-capacitive circuits RC of the second attenuator 43 here are also coupled to the control circuit MC, the resistive value and the capacitive value of the resistive-capacitive circuits are adjustable via the third setpoint signal Sc3.

The second device DIS2 also comprises a second matching circuit 31 coupled to the control circuit MC so as to receive a fourth setpoint signal Sc4 also allowing, in this example, the complex impedance of the assembly comprising the second attenuator 43 and the second matching circuit 31 to be maintained at a value substantially equal to the conjugate value of the complex impedance of the amplifier 44.

It should be noted that the control circuit MC could just as easily be configured for delivering a single setpoint signal to the attenuators 1 and 43 and to the matching circuits 3 and 31.

As indicated hereinbefore, the communications apparatus APP may, for example, be a cellular mobile telephone or a digital tablet, or any other device equipped with a radiofrequency transmitter and/or receiver.

FIG. 6 illustrates a cellular mobile telephone TMC comprising a transmission line LT of the same type as those previously described in relation with FIGS. 1 to 5.

FIG. 7 illustrates a digital tablet TN comprising a transmission line LT of the same type as those previously described in relation with FIGS. 1 to 5.

What is claimed is:
1. A transmission line, comprising:
an output interface; and at least one device coupled to the output interface, wherein the at least one device comprises:
an attenuator having an impedance that is controllable by a first setpoint signal,
an intermediate block having a complex impedance coupled to an output of the attenuator, and
a control circuit configured to adjust a value of the first setpoint signal in such a manner as to maintain a substantially constant power at the output interface, the attenuator and the intermediate block being configured so as to have conjugated respective impedances in the presence of a first setpoint signal having a first value, and
a matching circuit coupled to the attenuator and whose impedance is controllable by a second setpoint signal adjustable by the control circuit and which can take a second value in the presence of which the impedance of the matching circuit is such that the matching circuit has a negligible effect,
wherein the attenuator and the matching circuit are configured, in the presence of the first setpoint signal and of the second setpoint signal having, respectively, values different from the first value and from the second value, to maintain an equivalent impedance of an assembly comprising the attenuator and the matching circuit, the equivalent impedance being substantially equal to a conjugate of the complex impedance of the intermediate block.

2. The transmission line according to claim 1, wherein the attenuator comprises a first terminal and a second terminal, and wherein the matching circuit comprises a module having a complex impedance which is non-modifiable by the first setpoint signal, a first adjustment element coupled between a first terminal of the module and the first terminal of the attenuator, a second adjustment element coupled between a second terminal of the module and the second terminal of the attenuator, the first adjustment element and the second adjustment element having impedances that are adjustable by the second setpoint signal.

3. The transmission line according to claim 2, wherein the first and second adjustment elements comprise transistors having gates configured to receive the second setpoint signal, the second setpoint signal allowing the resistive value of the transistors in the conducting state to be modified.

4. The transmission line according to claim 3, wherein the module comprises at least one capacitor such that the matching circuit implements a variable capacitance.

5. The transmission line according to claim 4, wherein the module comprises a plurality of capacitors.

6. The transmission line according to claim 3, wherein the module comprises at least one coil such that the matching circuit implements a variable inductance.

7. The transmission line according to claim 6, wherein the module comprises a plurality of coils.

8. The transmission line according to claim 1, wherein the attenuator comprises at least one resistive-capacitive circuit having a resistive value and a capacitive value that are adjustable by the first setpoint signal.

9. The transmission line according to claim 8, wherein the at least one resistive-capacitive circuit comprises a transistor having a gate configured to receive the first setpoint signal, the first setpoint signal allowing the resistive value of the transistor in the conducting state to be modified.

10. The transmission line according to claim 1, wherein said at least one device comprises a plurality of devices coupled to the output interface.

11. The transmission line according to claim 1, wherein the first setpoint signal and the second setpoint signal have identical values.

12. The transmission line according to claim 1, wherein the first setpoint signal and the second setpoint signal have values set by a polynomial formula.

13. A circuit, comprising:
a transmission line having a first line and a second line;
an intermediate block having a complex impedance with a first terminal coupled to the first line and a second terminal coupled to the second line;
an amplifier having a first output driving the first line and a second output driving the second line;
an attenuator circuit coupled between the first and second lines and having a variable impedance that is controlled by a first setpoint signal;
a matching circuit coupled between the first and second lines and having a variable impedance that is controlled by a second setpoint signal;
a control circuit configured to generate the first and second setpoint signals, said control circuit operable to:
set a first value of the first setpoint signal to cause the variable impedance of the attenuator circuit to be substantially equal to a conjugate of the complex impedance of the intermediate block, and
set a second value of the first setpoint signal and a first value of the second setpoint signal to cause an equivalent impedance defined by the variable impedance of the attenuator circuit and the variable impedance of the matching circuit to be substantially equal to a conjugate of the complex impedance of the intermediate block.

14. The circuit of claim 13, wherein the intermediate block further includes a third terminal configured to be coupled to an antenna, said intermediate block comprising a transformer coupling the first and second terminals to the third terminal.

15. The circuit of claim 13, wherein the control circuit is further operable to set a second value of the second setpoint signal, when the first setpoint signal has the first value, so that the variable impedance of the matching circuit has a negligible effect.

16. The circuit of claim 13, wherein the attenuator circuit comprises a plurality of resistive-capacitive circuits connected in parallel between the first and second lines, each resistive-capacitive circuit comprising a first MOS transistor and a second MOS transistor of a same conductivity type connected in series with each other between the first and second lines, wherein gate terminals of the first and second MOS transistors receive the first setpoint signal.

17. The circuit of claim 13, wherein the matching circuit comprises:
a first variable resistance circuit coupled between the first line and a first intermediate node;
a module having a complex impedance which is non-modifiable coupled between the first intermediate node and a second intermediate node; and
a second variable resistance circuit coupled between the second intermediate node and the second line;
wherein impedances of the first and second variable resistance circuits are controlled by the second setpoint signal.

18. The circuit of claim 17, wherein the module is a capacitor.

19. The circuit of claim 17, wherein the module is a coil.

20. The circuit of claim 17, wherein the first and second variable resistance circuits are each formed by a MOS transistor having a gate terminal that receives the second setpoint signal.

21. The circuit of claim 20, wherein a body of each MOS transistor is coupled to a ground node.

22. The circuit of claim 21, wherein each of the first and second intermediate nodes are resistively coupled to the ground node.

23. The circuit of claim 13, wherein the transmission line is a component of a radiofrequency transmitter or receiver.

24. The circuit of claim 23, wherein the radiofrequency transmitter or receiver is a transmission device that is part of a cellular mobile telephone or a digital tablet.

25. The circuit of claim 13, wherein the first setpoint signal and the second setpoint signal have identical values.

26. The circuit of claim 13, wherein the first setpoint signal and the second setpoint signal have values set by a polynomial formula.

* * * * *